(12) United States Patent
Abe

(10) Patent No.: US 12,713,923 B2
(45) Date of Patent: Aug. 18, 2026

(54) SEMICONDUCTOR DEVICE MODULE AND METHOD FOR MANUFACTURING SAME

(71) Applicant: Mitsubishi Electric Corporation, Tokyo (JP)

(72) Inventor: Shunichi Abe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 772 days.

(21) Appl. No.: 18/000,998

(22) PCT Filed: Aug. 3, 2020

(86) PCT No.: PCT/JP2020/029679
§ 371 (c)(1),
(2) Date: Dec. 7, 2022

(87) PCT Pub. No.: WO2022/029843
PCT Pub. Date: Feb. 10, 2022

(65) Prior Publication Data

US 2023/0215778 A1 Jul. 6, 2023

(51) Int. Cl.
*H10W 40/77* (2026.01)
*H10W 40/00* (2026.01)
*H10W 74/01* (2026.01)
*H10W 74/10* (2026.01)
*H10W 74/47* (2026.01)

(52) U.S. Cl.
CPC ....... *H10W 40/778* (2026.01); *H10W 40/037* (2026.01); *H10W 74/014* (2026.01);
(Continued)

(58) Field of Classification Search
None
See application file for complete search history.

(56) References Cited

U.S. PATENT DOCUMENTS

2004/0070060 A1* 4/2004 Mamitsu ............. H10W 76/138
257/E23.092
2013/0063899 A1* 3/2013 Kuroda .............. H05K 7/20454
361/718

(Continued)

FOREIGN PATENT DOCUMENTS

CN 109891579 A * 6/2019 ........... H01L 23/367
JP 108-186203 A 7/1996

(Continued)

OTHER PUBLICATIONS

"Notice of Reasons for Refusal" Office Action issued in JP 2020-568480; mailed by the Japanese Patent Office on Mar. 2, 2021.

(Continued)

*Primary Examiner* — Dale E Page
*Assistant Examiner* — Rohit Parthasarathy
(74) *Attorney, Agent, or Firm* — Studebaker Brackett PLLC

(57) ABSTRACT

A semiconductor device module includes a device mounted on the surface of an organic substrate; a heat dissipation block bonded and fixed to the surfaces of the device; and a molded resin sealing the device with at least one surface of the heat dissipation block being exposed. The heat dissipation block includes a first portion and a second portion made of materials different in hardness: the first portion is harder than the second portion, and a gradient in hardness from the first portion on the side exposed from the molded resin to the second portion on the side bonded to the device, to keep a good grinding performance of grinding wheel.

4 Claims, 13 Drawing Sheets

(52) U.S. Cl.
CPC ........ *H10W 74/016* (2026.01); *H10W 74/114* (2026.01); *H10W 74/47* (2026.01)

(56) References Cited

U.S. PATENT DOCUMENTS

| | | | | |
|---|---|---|---|---|
| 2017/0170095 | A1* | 6/2017 | Matsubara | H10W 40/257 |
| 2018/0053719 | A1* | 2/2018 | Kim | H10W 20/42 |
| 2018/0061735 | A1 | 3/2018 | Matsubara | |
| 2019/0373773 | A1* | 12/2019 | Bougher | H05K 7/20409 |
| 2020/0043824 | A1* | 2/2020 | Tada | H10W 40/22 |
| 2023/0215778 | A1* | 7/2023 | Abe | H10W 40/778<br>257/74 |

FOREIGN PATENT DOCUMENTS

| | | | | | |
|---|---|---|---|---|---|
| JP | 2001-093923 | A | | 4/2001 | |
| JP | 2001-156219 | A | | 6/2001 | |
| JP | 2008-140877 | A | | 6/2008 | |
| JP | 2012174711 | A | * | 9/2012 | H01L 24/33 |
| JP | 2017-108046 | A | | 6/2017 | |
| JP | 2019-083292 | A | | 5/2019 | |

OTHER PUBLICATIONS

International Search Report issued in PCT/JP2020/029679; mailed Oct. 13, 2020.

An Office Action; mailed by the China National Intellectual Property Administration of the People's Republic of China on Apr. 30, 2025, which corresponds to Chinese Patent Application No. 202080103086.4 and is related to U.S. Appl. No. 18/000,998.

An Office Action; mailed by the United Kingdom Intellectual Property Office on Apr. 1, 2025, which corresponds to UK Patent Application No. GB2219739.6 and is related to U.S. Appl. No. 18/000,998.

* cited by examiner 40
42
20
10

SEMICONDUCTOR DEVICE MODULE AND METHOD FOR MANUFACTURING SAME

TECHNICAL FIELD

The present application relates to a semiconductor device module and a manufacturing method therefor.

BACKGROUND ARTS

A conventional semiconductor device module has been known as a hybrid module applicable to an RF product, in which pluralities of chip parts and devices are mounted on an organic substrate and sealed in a molded resin, and metal beat dissipation blocks having a high thermal conductivity is incorporated to dissipate externally from the module the heat generated during operation of the devices.

The heat dissipation blocks are capable of efficiently dissipating the heat generated in the devices externally from the module by putting one end of the blocks in contact with the heat generating devices and exposing the other ends thereof from the surface of the module. The heat dissipation blocks are bonded to the devices and then sealed in the molding resin after the plurality of devices are mounted on the organic substrate. Hence, it is difficult to align with high precision the heights of the plurality of heat dissipation blocks due to combination of dimensional tolerances in such as thickness of each device, height of each device after mounted, height of each heat dissipation block, and thickness of adhesive for each heat dissipation block, and of variation in workmanship. With this being the situation, when the molding die is closed to perform the resin sealing, the die and the heat dissipation blocks may come into contact with each other, thus damaging the devices.

In order to prevent the devices from being damaged, a method is disclosed in which the heat dissipation blocks formed low in height are sealed to be buried in the molding resin so that the heat dissipation blocks are brought into no contact with the die, and then the heat dissipation blocks are exposed by grinding the surface of the molded resin with a grinding wheel such as a diamond grinding wheel (see, for example, Patent Document 1).

PRIOR ART DOCUMENT

Patent Document

Patent Document 1: JP2012-174711A (Paragraph [0033], FIG. 1)

SUMMARY OF THE INVENTION

Problem that the Invention is to Solve

However, when the surface of the molded resin is ground, grinding performance decreases owing to occurrence of clogging of the grinding wheel because the heat dissipation blocks are made of a soft material, thus causing a problem that quality defects such as burrs on the heat dissipation blocks and chipping of the molded resin are likely to occur. Furthermore, in order to prevent the decrease in grinding performance, frequent dressing is necessary to eliminate clogging of the grinding wheel, thus causing a problem of reducing productivity.

The present application discloses a technology for resolving the above-described problems and aims at providing a semiconductor device module and a manufacturing method therefor that can prevent quality defects due to clogging of the grinding wheel when the heat dissipation blocks buried in the molded resin are ground with the grinding wheel such as a diamond grinding wheel and can improve productivity of the semiconductor device module.

Means for Solving the Problem

A semiconductor device module disclosed in the present application is characterized in that it includes a device mounted on a surface of a substrate; a heat dissipation block formed on a surface of the device; and a molded resin sealing the device with at least one surface of the heat dissipation block being exposed, wherein the heat dissipation block includes portions made of two different hardness materials.

Another semiconductor device module disclosed in the present application is characterized in that it includes a device and a dummy block mounted on a surface of a substrate; a heat dissipation block mounted on the device; and a molded resin sealing the devices with at least one surface of the heat dissipation block being exposed, wherein the dummy block has a height from the substrate comparable to the heat dissipation block and is harder in material than the heat dissipation block.

A method of manufacturing a semiconductor device module disclosed in the present application is characterized in that it includes a step of mounting a device on a surface of a substrate; a step of fixing a heat dissipation block to a surface of the device; a step of sealing in a molding resin the device having the heat dissipation block fixed to the surface of the device; and a step of grinding the molded resin until at least one surface of the heat dissipation block is disposed, wherein the heat dissipation block includes portions made of two different hardness materials.

Another method of manufacturing a semiconductor device module disclosed, in the present application is characterized in that it includes a step of mounting a device on a surface of a substrate; a step of fixing a heat dissipation block to a surface of the device; a step of forming a dummy block on a surface of the substrate; a step of sealing in a molding resin the device having the heat dissipation block fixed to the surface of the device; and a step of grinding the molded resin until at least one surface of the heat dissipation block is exposed, wherein the dummy block has a height from the substrate comparable to or higher than the heat dissipation block and is harder in material than the heat dissipation block.

Still another method of manufacturing a semiconductor device module disclosed in the present application is characterized in that it includes a step of mounting a device on a surface of a substrate; a step of fixing a heat dissipation block to a surface of the device; a step of forming a dummy block on a surface of the substrate along dicing lines; a step of sealing in a molding resin the device having the heat dissipation block fixed to the surface of the device, and a step of grinding the molded resin until at least one surface of the heat dissipation block is exposed, wherein the dummy block has a height from the substrate comparable to or higher than the heat dissipation block, and is harder in material than the heat dissipation block.

Advantageous Effect of the Invention

According to the present application, a good grinding performance of the grinding wheel can be kept, thereby being able to bring about effects of stabilizing product quality and improving productivity.

DETAILED DESCRIPTION OF THE INVENTION

Embodiment 1

Figure 1A:
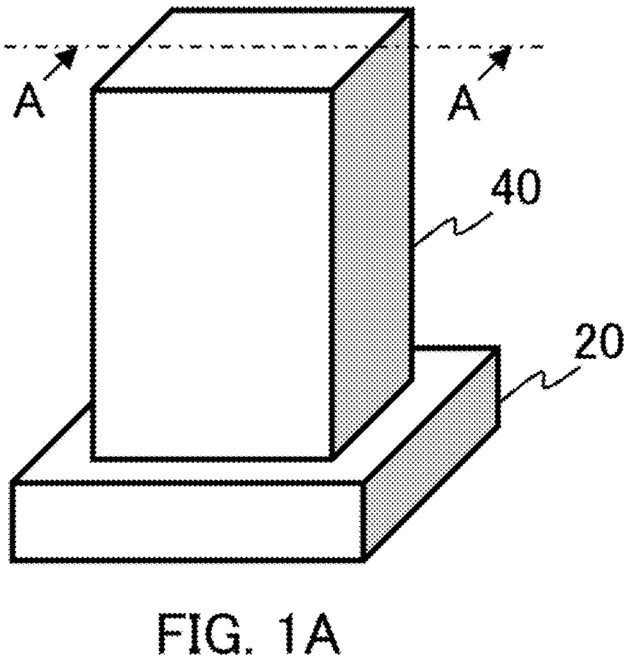
FIGS. 1A and 1B are a perspective view and a sectional view showing a structure of the major part of a semiconductor device module according to Embodiment 1.
Figure 1B:
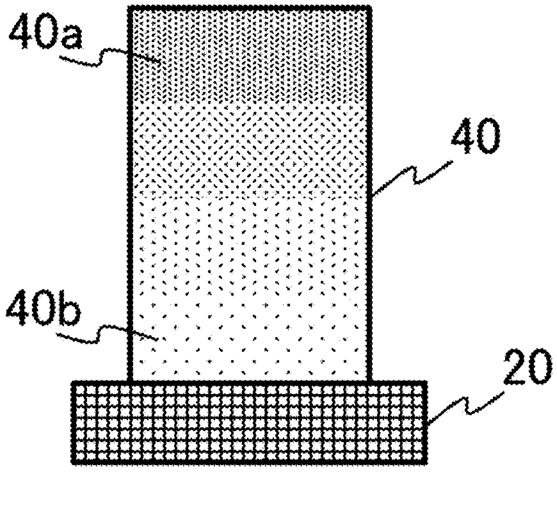
Figure 2:
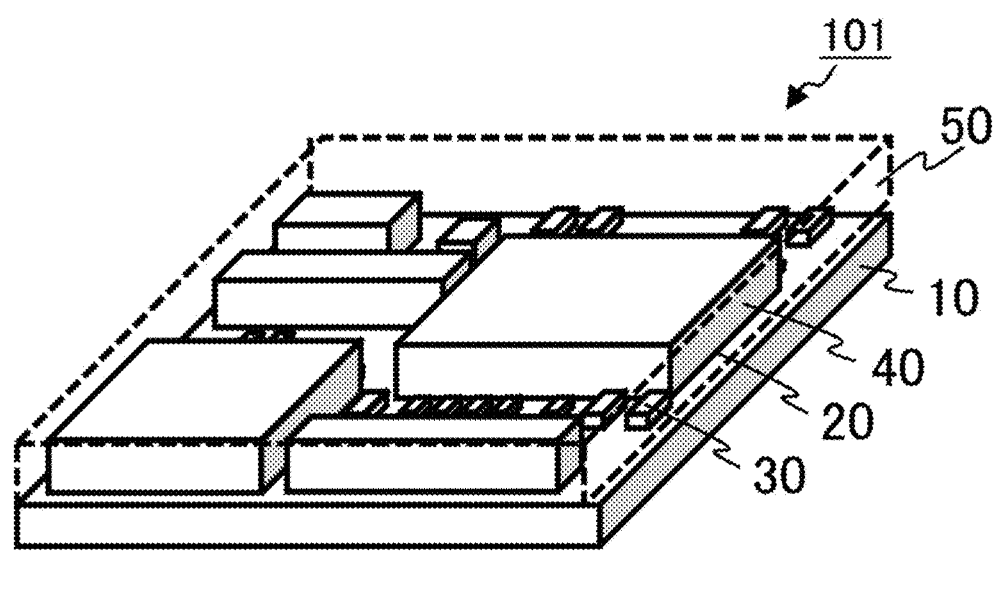
FIG. 2 is a perspective view showing a whole configuration of the semiconductor device module according to Embodiment 1.

FIGS. 1A and FIG. 1B are views showing a structure of the major part of a semiconductor device module according to Embodiment 1 of the present application. FIG. 1A is a perspective view, and FIG. 1B is a cross-sectional view taken in the direction of the arrows along the line A-A of FIG. 1A. FIG. 2 is a perspective view showing a whole configuration of the semiconductor device module.

As shown in FIG. 2, the semiconductor device module 101 includes an organic substrate 10, devices 20 and chip parts 30 mounted on the surface of the organic substrate 10, heat dissipation blocks 40 formed in contact with the surfaces of the devices 20, and a molded resin 50 sealing the devices 20 and the chip parts 30 with the top surfaces of the heat dissipation blocks 40 being exposed. The major part of the semiconductor device module 101 consists of each of the heat dissipation blocks 40 and each of the devices 20 as shown in FIGS. 1A and 1B.

The heat dissipation blocks 40 each have a first portion 40*a* that is made of a hard and good grindability material alloyed with oxygen-free copper and formed on the side exposed from the module, and a second portion 40*b* that is made of a soft and high thermal-conductivity material of oxygen-free copper and formed on the side in contact with each device. Moreover, each heat dissipation block 40 has a portion that gradually changes in metal composition from the first portion 40*a* on the side exposed from the molded resin 50 to the second portion 40*b* on the side in contact with each device 20.

This brings no reduction in heat dissipation from the devices, and further no clogging of the diamond grinding wheel, no occurrence of quality faults such as burrs and chipping of the molded resin, and no need of frequent dressing of the diamond grinding wheel because the hard material portion is ground.

Figures 3A, 3B, 3C, 3D:
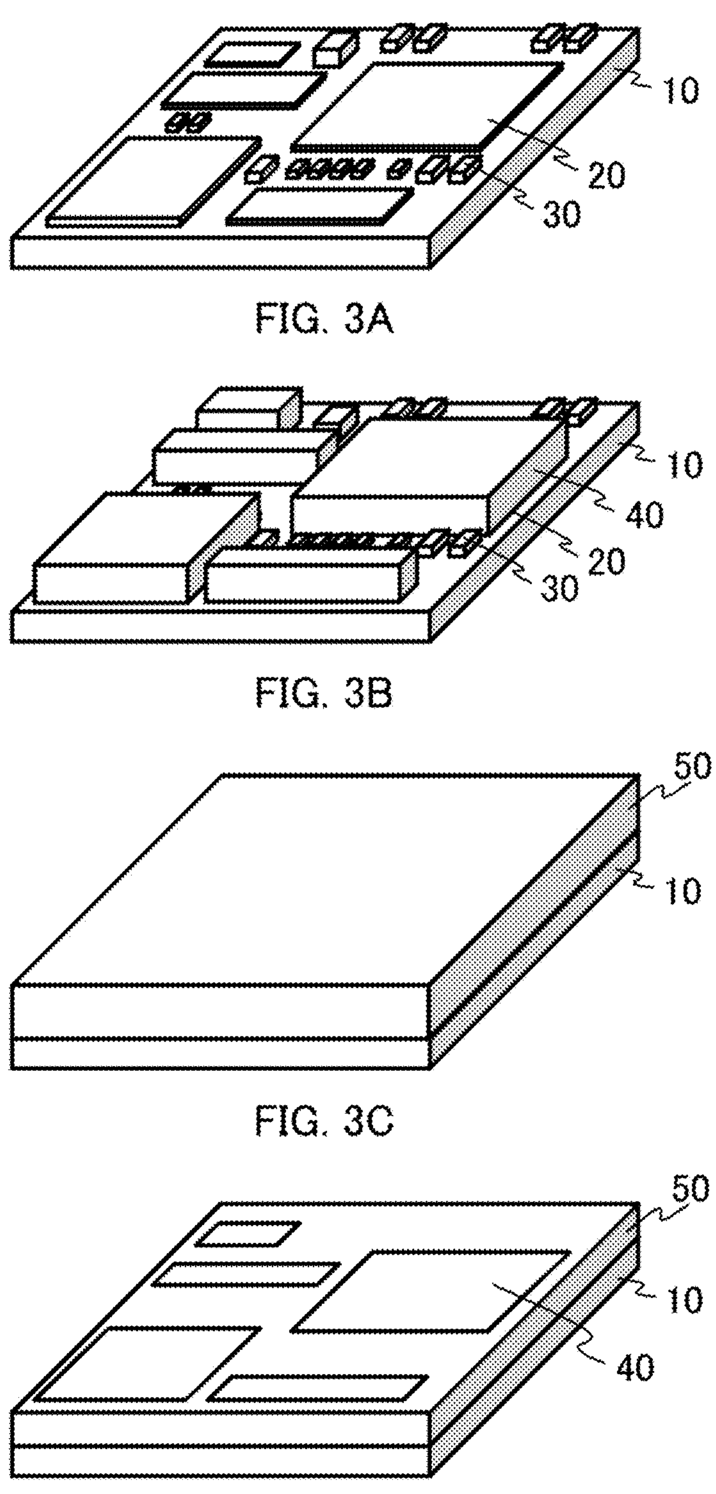
FIGS. 3A to 3D are perspective views respectively showing steps of manufacturing the semiconductor device module according to Embodiment 1.
Figure 4:
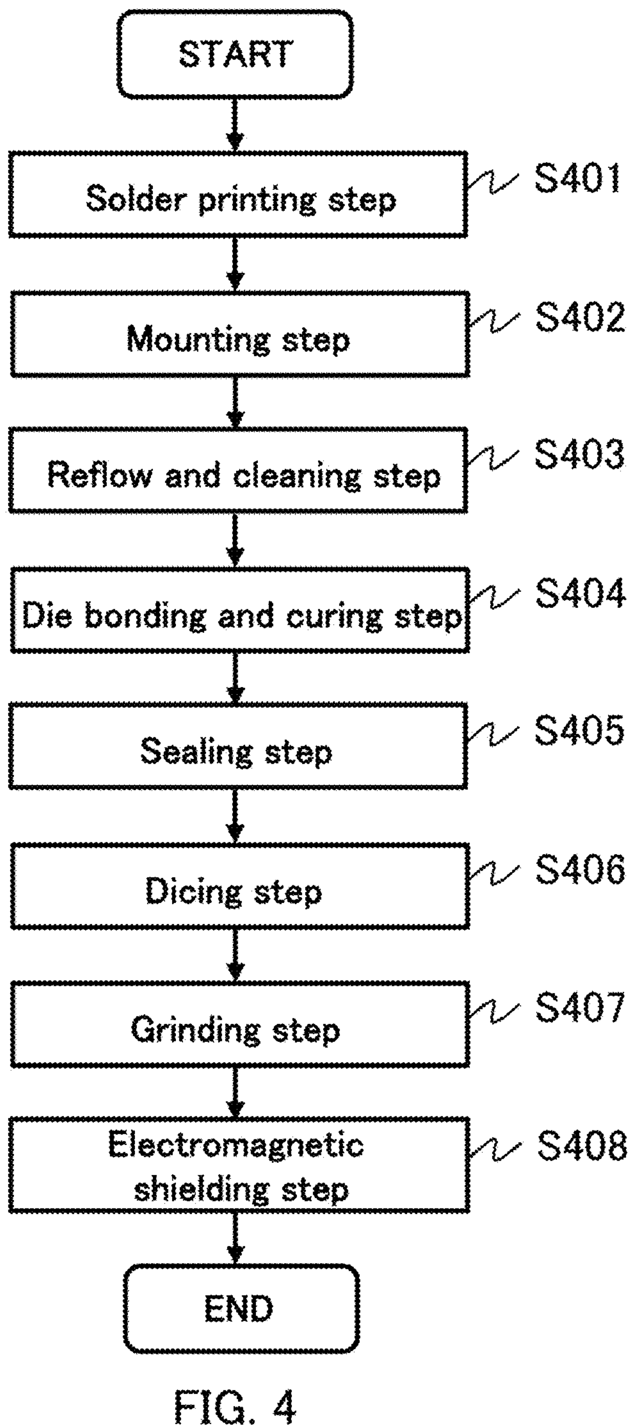
FIG. 4 is a flowchart showing the steps of manufacturing the semiconductor device module according to Embodiment 1.

Next, a method of manufacturing the semiconductor device module 101 according to Embodiment 1 of the present application is described with reference to FIGS. 3A to 3B and FIG. 4. FIGS. 3A to 3B are views respectively showing steps of manufacturing the semiconductor device module 101 according to Embodiment 1. FIG. 4 is a flowchart showing a procedure of manufacturing the semiconductor device module 101 according to Embodiment 1.

First, a solder paste is applied to the surface of the organic substrate 10 in a solder printing step (Step S401), and then the chip parts 30 and the devices 20 are mounted on the organic substrate 10 in a mounting step (Step S402), as shown in FIG. 3A.

Subsequently, the chip parts 30 and the devices 20 are soldered to the organic substrate 10, and then the organic substrate having the chip parts 30 and the devices 20 soldered thereto is cleaned in a reflow and cleaning step (Step S403).

Next, the heat dissipation blocks 40 are placed on the devices 20 with an adhesive being sandwiched therebetween and fixed to the devices by heat treatment in a die bonding and curing step (Step S404), as shown in FIG. 3B.

Subsequently, the chip parts 30 and devices 20 on the organic substrate 10 are sealed in the molding resin 50 in a sealing step (Step S405), and then the organic substrate 10 is diced into the individual module in a dicing step (Step S406), as shown in FIG. 3C.

Finally, the surface of the molded resin 50 is ground in a grinding step (Step S407) to expose the heat dissipation blocks 40 as shown in FIG. 3D. After that, the semiconductor device module is electromagnetically shielded for electrical requirement in an electromagnetic shielding step (Step S408) to complete.

As described above, the semiconductor device module 101 according to Embodiment 1 includes the devices 20 mounted on the surface of the organic substrate 10; the heat dissipation blocks bonded and fixed to the surfaces of the devices 20; and the molded resin 50 sealing the devices 20 with at least one surface of each heat dissipation block 40 being exposed, wherein the heat dissipation blocks 40 each include the first portion 40*a* and the second portion 40*b* made of the materials different in hardness: the first portion 40*a* is harder than the second portion 40*b*, and a gradient in material from the first portion 40*a* on the side exposed from the molded resin 50 to the second portion 40*b* on the side bonded to each device 20, and the method of manufacturing the semiconductor device module 101 of Embodiment 1 includes the step of mounting the devices 20 on surface of the organic substrate 10; the step of fixing the heat dissipation blocks 40 to the surfaces of the devices 20; the step of sealing in the molding resin 50 the devices 20 having the heat dissipation blocks 40 fixed to the surfaces; and the step of grinding the molded resin 50 until at least one surface of each heat dissipation block 40 is exposed, wherein the heat dissipation blocks 40 each include the first portion 40*a* and the second portion 40*b* made of the two different hardness materials: the first portion 40*a* is harder than the second portion 40*b*, and the gradient in material from the first portion 40*a* on the side exposed from the molded resin 50 to the second portion 40*b* on the side in contact with each device 20. Hence, heat dissipation from the devices is not reduced, and a good grinding performance of the grinding wheel can be kept without clogging the diamond grinding wheel because the hard material portion is ground. Furthermore, no quality faults such as burrs and chipping of the molded resin occur and no frequent dressing of the diamond grinding wheel is needed, thus being able to bring about effects of stabilizing product quality and improving productivity.

Embodiment 2

While each heat dissipation block 40 is formed to have the gradient in material from the first portion 40*a* to the second portion 40*b* in Embodiment 1, Embodiment 2 describes a case of layering alternatively first portions and second portions.

Figure 5A:
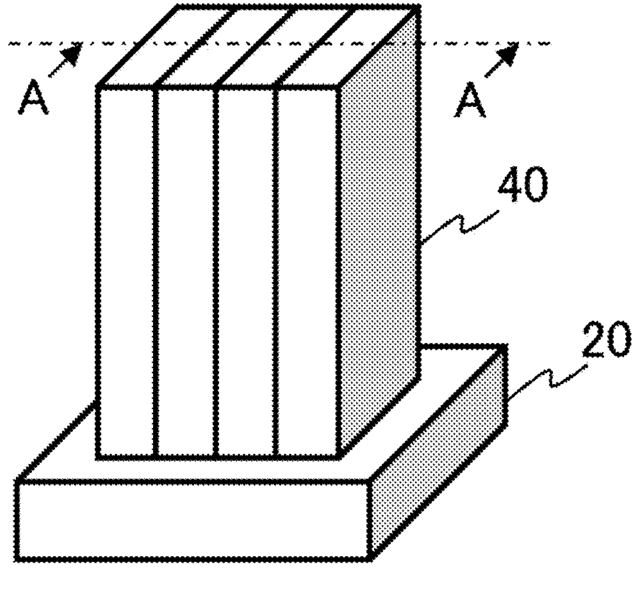
FIGS. 5A and 5B are a perspective view and a sectional view showing a structure of the major part of the semiconductor device module according to Embodiment 2.
Figure 5B:
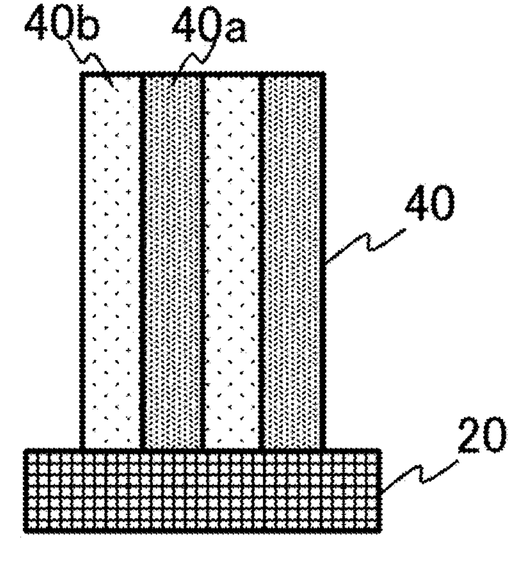

FIGS. 5A and 5B are views showing a structure of the major part of the semiconductor device module according to Embodiment 2 of the present application. FIG. 5A is a perspective view, and FIG. 5B is a cross-sectional view taken in the direction of the arrows along the line A-A of FIG. 5A.

Heat dissipation blocks 40 according to Embodiment 2 of the present application each are formed such that the first portions 40*a* made of the hard material having the good grindability for the diamond grinding wheel and the second portions 40*b* made of the soft material having the high thermal conductivity are alternatively layered in the direction parallel to the surface of each device 20 as shown in FIG. 5A and FIG. 5B. In Embodiment 2, the configuration of the other components of the semiconductor device module and the manufacturing method therefor are the same as with the semiconductor device module 101 according to Embodiment 1; hence, the same numeral references are assigned to the corresponding parts and descriptions thereof are omitted.

Since the soft portions and the hard portions are ground concurrently, the grinding wheel is sharpened (self-sharpened) when the hard portions are ground, thus being able to keep the grinding performance of the grinding wheel. Moreover, the high heat-conductivity material can also be exposed from the surface of the module, thus being able to also ensure heat dissipation from the devices.

As described above, the semiconductor device module according to Embodiment 2 has the heat dissipation blocks 40 each formed such that the first portions 40*a* and the second portions 40*b* made of the two different hardness materials are alternatively layered in parallel to the surface of each device 20. Since the soft portions and the hard portions are ground concurrently, the grinding wheel is sharpened (self-sharpened) when the hard portions are ground, thus being able to keep grinding performance of the grinding wheel. Moreover, the high heat-conductivity material can also from the surface of the module, thus being able to also ensure heat dissipation from the devices.

Embodiment 3

While the heat dissipation blocks 40 each are formed such that the portions made of the two different hardness materials are alternatively layered in Embodiment 2, Embodiment 3 describes a case of forming one of portions in a hollow shape.

Figure 6A:
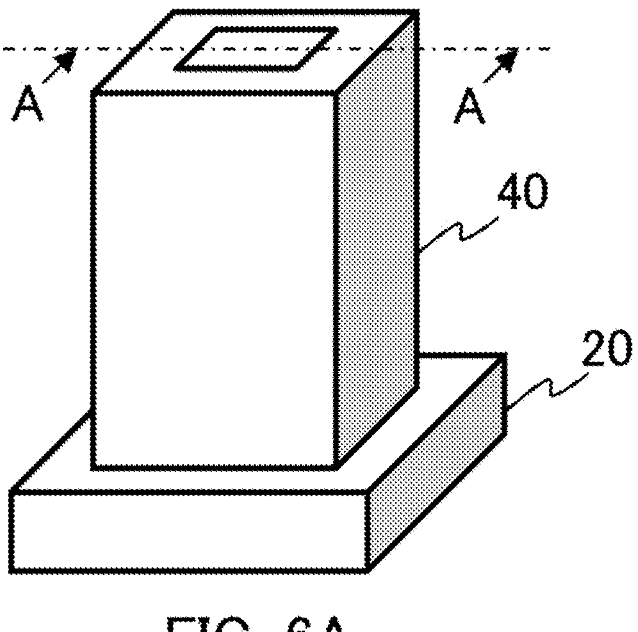
FIGS. 6A and 6B are a perspective view and a sectional view showing a structure of the major part of the semiconductor device module according to Embodiment 3.
Figure 6B:
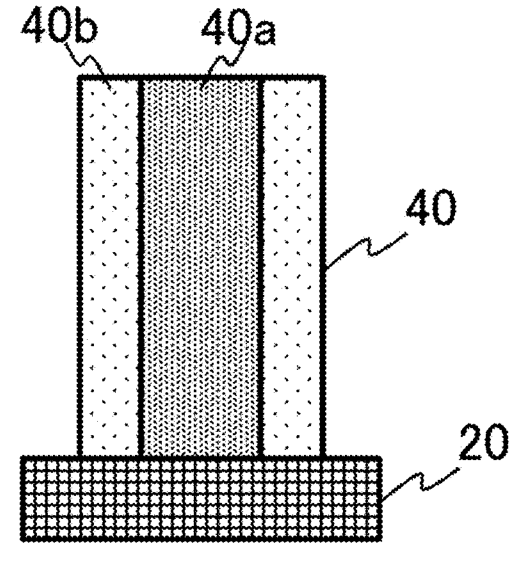

FIGS. 6A and 6B are views showing a structure of the major part of a semiconductor device module according to Embodiment 3 of the present application. FIG. 6A is a perspective view, and FIG. 6B is a cross-sectional view taken in the direction of the arrows along the line A-A of FIG. 6A.

As shown in FIG. 6A and FIG. 6B, heat dissipation blocks 40 according to Embodiment 3 of the present application each are formed such that a second portion 40*b* made of the soft material having the high thermal conductivity is formed in a hollow shape and a first portion 40*a* made of the hard material having the good grindability for the diamond grinding wheel is inserted inside the hollow. In Embodiment 3, the configuration of the other components of the semiconductor device module and the manufacturing method therefor are the same as with the semiconductor device module 101 according to Embodiment 1; hence, the same numeral references are assigned to the corresponding parts and descriptions thereof are omitted.

Since the soft portion and the hard portion are ground concurrently, the grinding wheel is sharpened (self-sharpened) when the hard portion is ground, thus being able to keep grinding performance of the grinding wheel. Moreover, the high thermal conductivity material can also be exposed from the surface of the module, thus being able to also ensure heat dissipation from the devices.

As described above, according to the semiconductor device module of Embodiment 3 has the heat dissipation blocks 40 each are formed such that the second portion 40*b* is formed in a hollow shape in the direction perpendicular to the surface of each device and the first portion 40*a* made of the material harder than the second portion 40*b* is formed inside the hollow of the second portion 40*b*. Since the soft portion and the hard portion are ground concurrently, the grinding wheel is sharpened (self-sharpened) when the hard portion are ground, thus being able to keep grinding performance of the grinding wheel. Moreover, the high thermal conductivity material can also be exposed from the surface of the module, thus being able to also ensure heat dissipation from the devices.

Figure 7A:
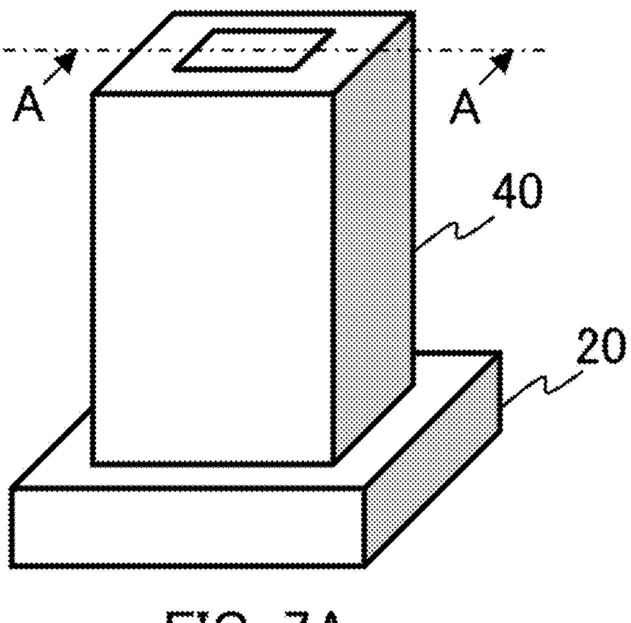
FIGS. 7A and 7B are a perspective view and a sectional view showing another structure of the major part of the semiconductor device module according to Embodiment 3.
Figure 7B:
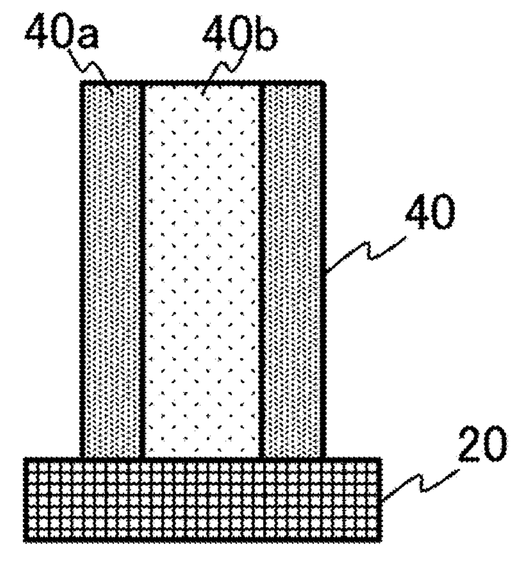

Note that although the second portion 40*b* made of the soft material is formed in a hollow shape in Embodiment 3, the hollow-shaped portion is not limited to this. FIG. 7A and FIG. 7B are views showing another structure of the major part of the semiconductor device module according to Embodiment 3 of the present application. FIG. 7A is a perspective view, and FIG. 7B is a sectional view taken in the direction of the arrows along the line A-A of FIG. 7A. As shown in FIG. 7A and FIG. 7B, each heat dissipation block 40 may be formed such that a first portion 40*a* made of the hard material is formed in a hollow shape and a second portion 40*b* made of the soft material is formed inside the hollow of the first portion 40*a*. This case can also bring about the same effect as with the Embodiment 3.

Embodiment 4

While the second portion 40*b* of each heat dissipation block 40 is formed in a hollow shape in Embodiment 3, Embodiment 4 describes a case of forming the portion in a grid shape.

Figure 8A:
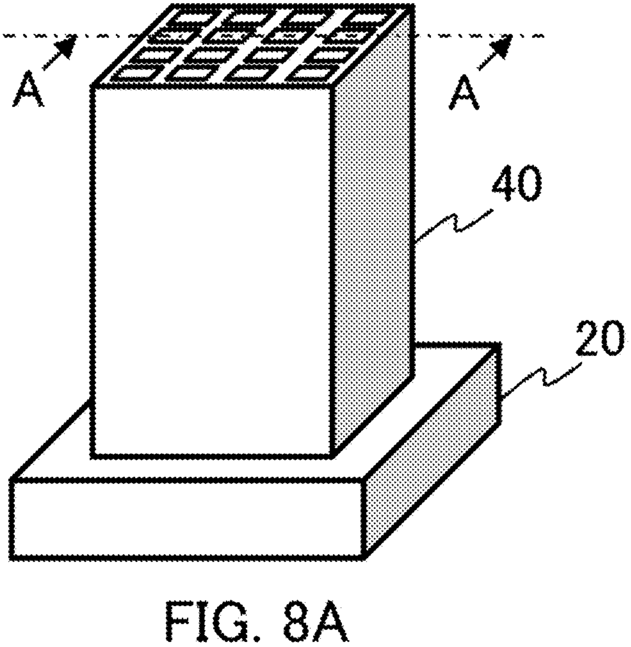
FIGS. 8A and 8B are a perspective view and a sectional view showing a structure of the major part of the semiconductor device module according to Embodiment 4.
Figure 8B:
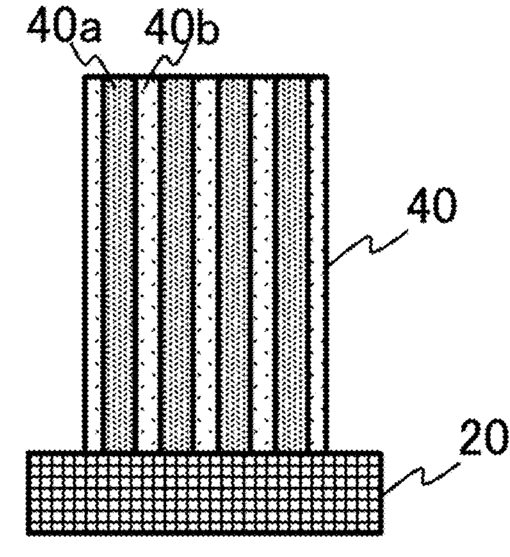

FIG. 8A and FIG. 8B are views showing a structure of the major part of the semiconductor device module according to Embodiment 4 of the present application. FIG. 8A is a perspective view, and FIG. 8B is a sectional view taken in the direction of the arrows along the line A-A of FIG. 8A.

As shown in FIG. 8A and FIG. 8B, heat dissipation blocks 40 according to Embodiment 4 of the present application each are formed such that the second portion 40*b* made of the soft material having the high thermal conductivity is formed in a grid shape and first portions 40*a* made of the hard material having the good grindability for the diamond grinding wheel are inserted inside the grid. In Embodiment 4, the configuration of the other components of the semiconductor device module and the manufacturing method therefor are the same as with the semiconductor device module 101 according to Embodiment 1; hence, the same numeral references are assigned to the corresponding parts and descriptions thereof are omitted.

Since the soft portion and the hard portions are ground concurrently, the grinding wheel is sharpened (self-sharpened) when the hard portions are ground, thus being able to keep grinding performance of the grinding wheel. Moreover, the high thermal-conductivity material can also be exposed from the surface of the module, thus being able to also ensure heat dissipation from devices can also be ensured.

As described above, the semiconductor device module according to Embodiment 4 has the heat dissipation blocks 40 each formed such that the second portion 40*b* is formed in a grid shape in the direction perpendicular to the surface of each device 20 and the first portions 40*a* made of the material harder than the second portion 40*b* is formed inside the grid of the second portion 40*b*. Since the soft portion and the hard portions are ground concurrently, the wheel stone is sharpened when grinding the hard portion, thus being able to keep grinding performance of the grinding wheel. Moreover, the high thermal-conductivity material can also be exposed from the surface of the module, thus being able to ensure heat dissipation from the devices.

Figure 9A:
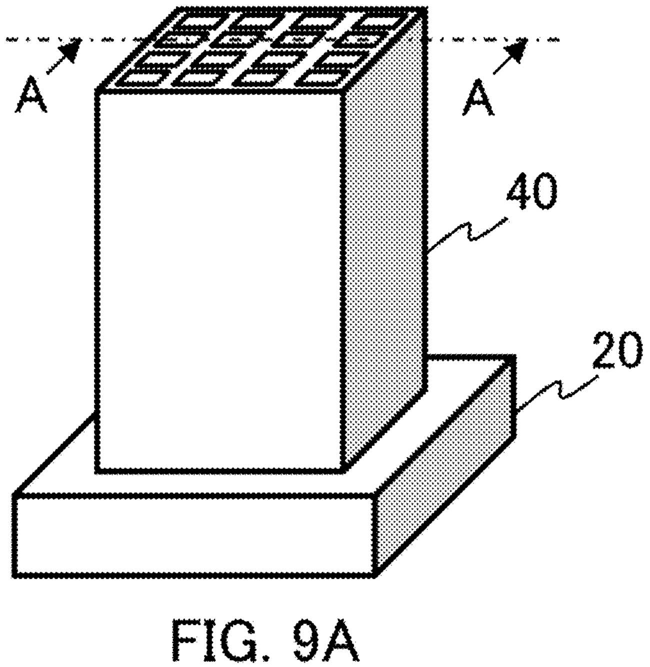
FIGS. 9A and 9B are a perspective view and a sectional view showing another structure of the major part of the semiconductor device module according to Embodiment 4.
Figure 9B:
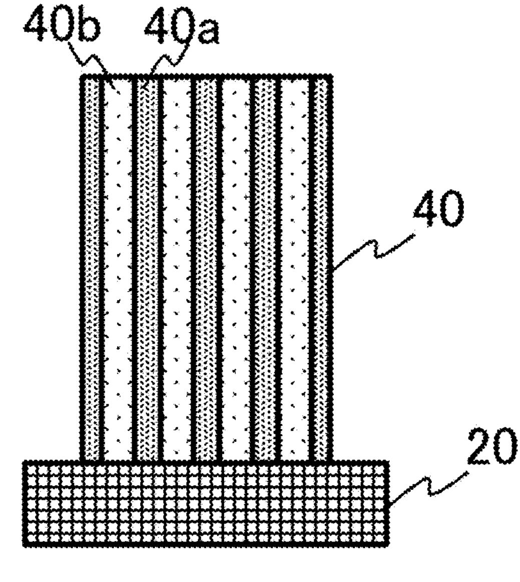

Note that although the second portion 40*b* made of the soft material is formed in the grid shape in Embodiment 4, the grid-shaped portion is not limited to this. FIG. 9A and FIG. 9B are views showing another structure of the major part of the semiconductor device module according to Embodiment 4 of the present application. FIG. 9A is a perspective view, and FIG. 9B is a cross-sectional view taken in the direction of the arrows along the line A-A of FIG. 9A. As shown in FIG. 9A and FIG. 9B, the heat dissipation blocks 40 each may be formed such that a first portion 40*a* made of the hard material is formed in a grid shape and second portions 40*b* made of the soft material are formed inside the grid of the first portion 40*a*. This case can also bring about the same effect as with the Embodiment 4.

Embodiment 5

While the second portion 40*b* of each heat dissipation block 40 is formed in a grid shape in Embodiment 4, Embodiment describes a case of plating a second portion.

Figure 10A:
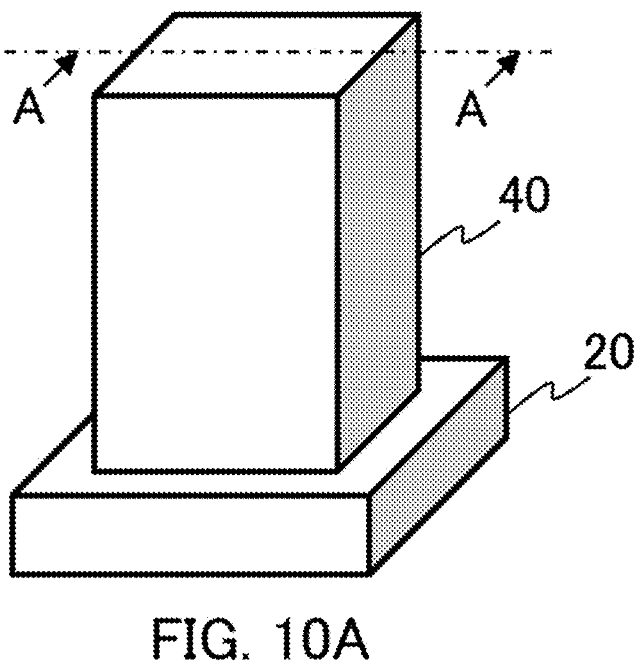
FIGS. 10A and 10B are a perspective view and a sectional view showing a structure of the major part of the semiconductor device module according to Embodiment 5.
Figure 10B:
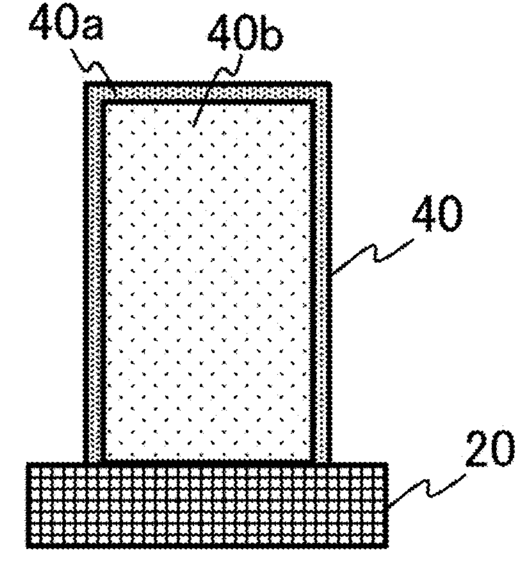

FIG. 10A and FIG. 10B are views showing structure of the major part of a semiconductor device module according to Embodiment 5 of the present application. FIG. 10A is a perspective view, and FIG. 10B is a cross-sectional view taken in the direction of the arrows along the line A-A of FIG. 10A.

As shown in FIG. 10A and FIG. 10B, heat dissipation blocks 40 according to Embodiment 5 of the present application each are formed such that the surface of the second portion 40*b* made of the soft material having the high thermal conductivity is plated with a first portion 40*a* made of the hard material having the good grindability for the diamond grinding wheel. In Embodiment 5, the configuration of the other components of the semiconductor device module and the manufacturing method therefor are the same as with the semiconductor device module 101 according to Embodiment 1; hence, the same numeral references are assigned to the corresponding parts and descriptions thereof are omitted.

Since the hard portion is ground, the grinding wheel is sharpened (self-sharpened), thus being able to keep grinding performance of the grinding wheel. Moreover, since the plated portion at the exposed surface of each heat dissipation block is removed after the grinding finished, the high thermal-conductivity material is exposed from the surface of the module, thus being able to ensure also heat dissipation from the devices.

As described above, according to the method of manufacturing the semiconductor device module of Embodiment 5, the heat dissipation blocks 40 each are formed such that the top surface and side surfaces of the second portion 40*b* fixed to the surface of each device 20 are plated with the first portion 40*a* made of the material harder than the second portion 40*b*, and then the first portion 40*a* at the top surface of each heat dissipation block 40 is removed in the grinding step. Since the hard portion is ground, the grinding wheel is sharpened (self-sharpened), thus being able to keep grinding performance of the grinding wheel. Moreover, since the plated portion of the exposed surface of each heat dissipation block is removed after the grinding finished, the high thermal-conductivity material is exposed from the surface of the module, thus being able to also ensure heat dissipation from the devices.

Embodiment 6

While the surface of the second portion 40*b* of each heat dissipation block 40 is plated with the first portion 40*a* in Embodiment 5, Embodiment 6 describes a case of forming a hard material portion at the top end of each heat dissipation block.

Figure 11A:
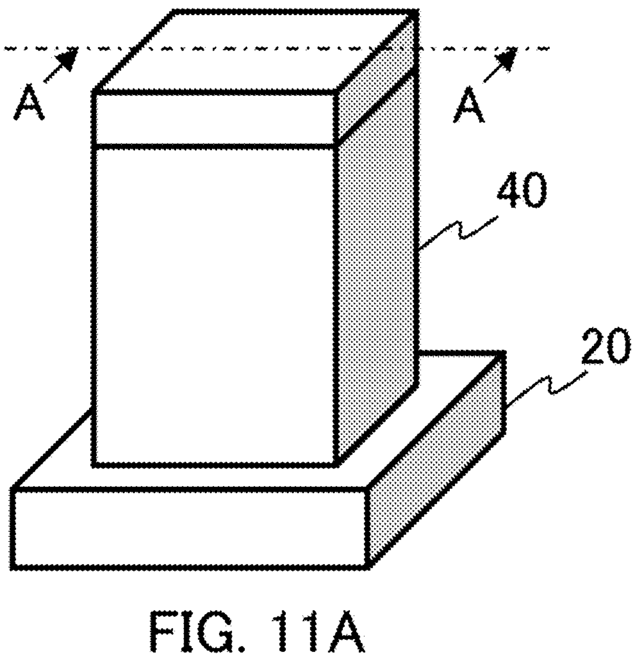
FIGS. 11A and 11B are a perspective view and a sectional view showing a structure of the major part of the semiconductor device module according to Embodiment 6.
Figure 11B:
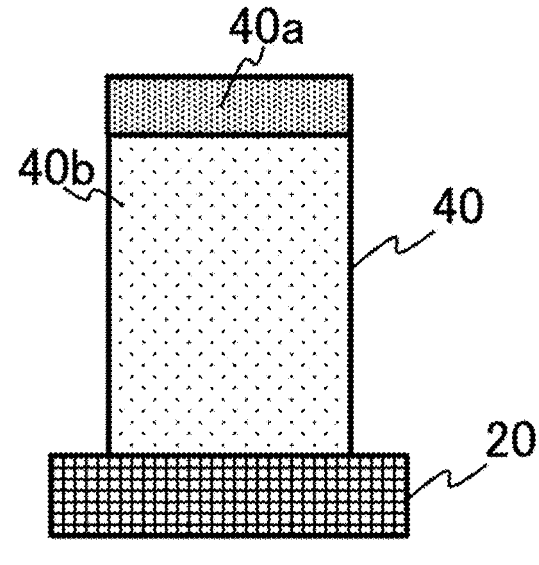

FIG. 11A and FIG. 11B are views showing a structure of the major part of the semiconductor device module according to Embodiment 6 of the present application. FIG. 11A is a perspective view, and FIG. 11B is a cross-sectional view taken in the direction of the arrows along the line A-A of FIG. 11A.

As shown in FIG. 11A and FIG. 11B, the heat dissipation blocks 40 according to Embodiment 6 of the present application each are formed such that a first portion 40*a* made of the hard material having the good grindability for the diamond grinding wheel is layered on the top of a second portion 40*b* made of the soft material having the high thermal conductivity. In Embodiment 6, the configuration of the other components of the semiconductor device module and the manufacturing method therefor are the same as with the semiconductor device module 101 according to Embodiment 1; hence, the same numeral references are assigned to the corresponding parts and descriptions thereof are omitted.

Since the hard portion is grounded, the grinding wheel is sharpened (self-sharpened), thus being able to keep grinding performance of the grinding wheel. Moreover, since the hard material at the top of each heat dissipation block is ground without residue after the grinding finished to expose the second portion from surface of the module, heat dissipation from the devices can also be ensured.

As described above, according to the method of manufacturing the semiconductor device module of Embodiment 6, the heat dissipation blocks 40 each is formed such that the first portion 40*a* made of the material harder than the second portion 40*b* is formed on the top of the second portion 40*b* formed on the each device 20, and then the first portion 40*a* at the top of each heat dissipation block 40 is removed in the grinding step. Since the hard portion is ground, the grinding wheel is sharpened (self-sharpened) by grinding, thus being able to keep grinding performance of the grinding wheel. Moreover, since the hard material at the top of each heat dissipation block is ground without residue after the grinding finished to expose the second portion from the surface of the module, heat dissipation from the devices can also be ensured.

Embodiment 7

While the first portion 40*a* is formed on the top of the second portion 40*b* in Embodiment 6, Embodiment 7 describes a case of forming dummy blocks.

Figure 12:
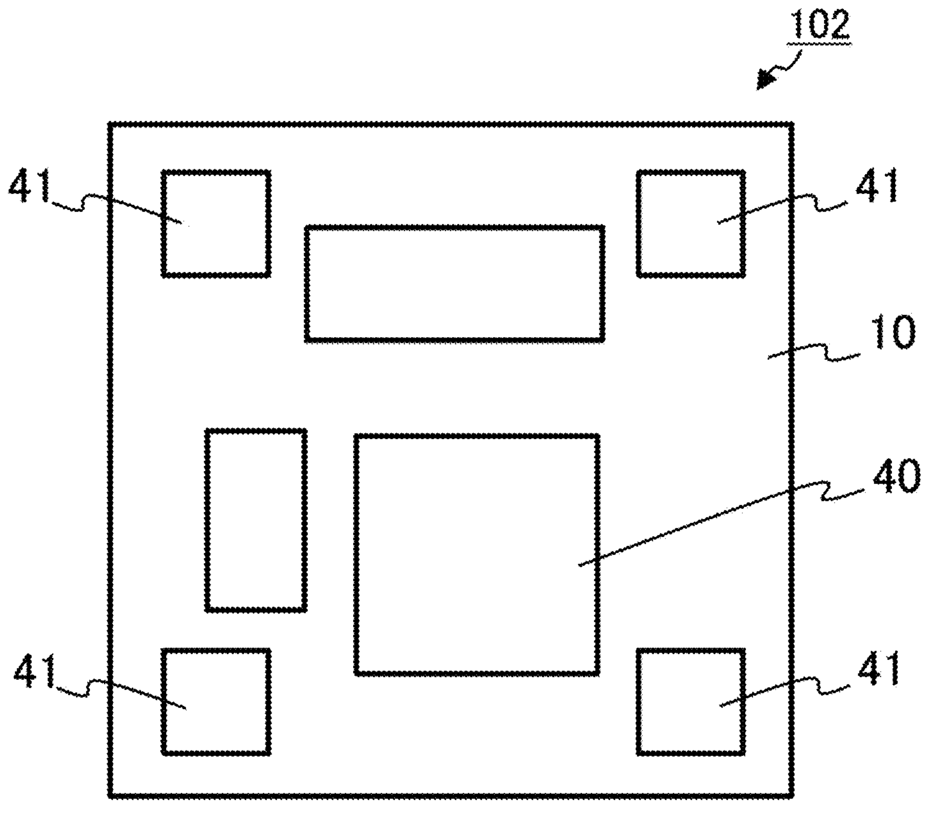
FIG. 12 is a plan view showing a configuration of a semiconductor device module according to Embodiment 7.

FIG. 12 is a plan view showing a configuration of a semiconductor device module according to Embodiment 7 of the present application, in which the molded resin is not shown. As shown in FIG. 12, the semiconductor device module 102 according to Embodiment 7 of the present application is configured such that dummy blocks 41 that are made of the hard material having the good grindability for the diamond grinding wheel and have a height from the organic substrate 10 comparable to the heat dissipation blocks 40 are formed and arranged at the four corners of the module, i.e., on areas of the organic substrate where no devices and no chip parts are mounted. In Embodiment 7, the configuration of the other components of the semiconductor device module 102 and the manufacturing method therefor are the same as with the semiconductor device module 101 according to Embodiment 1; hence, the same numeral references are assigned to the corresponding parts and descriptions thereof are omitted.

Since the soft material and the hard material are ground concurrently, the grinding wheel is sharpened (self-sharpened), thus being able to keep grinding performance of the grinding wheel. Moreover, by exposing from the surface of the module the heat dissipation blocks having the high thermal conductivity, heat dissipation from the devices can also be ensured. Furthermore, a conventional heat dissipation block can be used.

As described above, the semiconductor device module 102 according to Embodiment 7 includes the devices 2 and the dummy blocks 41 mounted on the surface of the organic substrate 10; the heat dissipation blocks 40 bonded and fixed to the surface of the devices 20; the molded resin 50 sealing the devices 20 with at least one surface of each heat dissipation block 40 being exposed, wherein the dummy blocks 41 are made of a material harder than the heat dissipation blocks 40 and have a height from the organic substrate 10 comparable to the heat dissipation blocks 40, and the method of manufacturing the semiconductor device module 102 according to Embodiment 7 includes the step of mounting the devices 20 on the surface of the organic substrate 10; the step of fixing the heat dissipation blocks 40 to surfaces of the devices 20; a step of forming the dummy blocks 41 on the surface of the organic substrate 10; the step of sealing in the molding resin 50 the devices 20 having the heat dissipation blocks 40 fixed to the surfaces of the devices; and the step of grinding the molded resin 50 until at least one surface of each heat dissipation block 40 is exposed, wherein the dummy blocks 41 are made of a material harder than the heat dissipation blocks 40 and have a height from the organic substrate 10 comparable to the heat dissipation blocks 40. Since the soft material and the hard material are ground concurrently, the grinding wheel is sharpened (self-sharpened) by grinding the hard portion, thus being able to keep grinding performance of the grinding wheel. Moreover, by exposing from the surface of the module the heat dissipation blocks having the high thermal conductivity, heat dissipation from the devices can also be ensured. Furthermore, a conventional heat dissipation block can be used.

Note that although the grinding step (Step S407 in FIG. 4) is executed after the dicing step (Step S406 in FIG. 4) in Embodiments 1 to 7, the order of executing these steps is not limited to this. The dicing step (Step S406 in FIG. 4) may be executed after the grinding step (Step S407 in FIG. 4). This case can also bring about the effects described in each Embodiment.

Embodiment 8

While the dummy blocks are formed on the surface of the organic substrate 10 in Embodiment 7, Embodiment 8 describes a case of forming a dummy block along the margin for dicing.

Figures 13A, 13B:
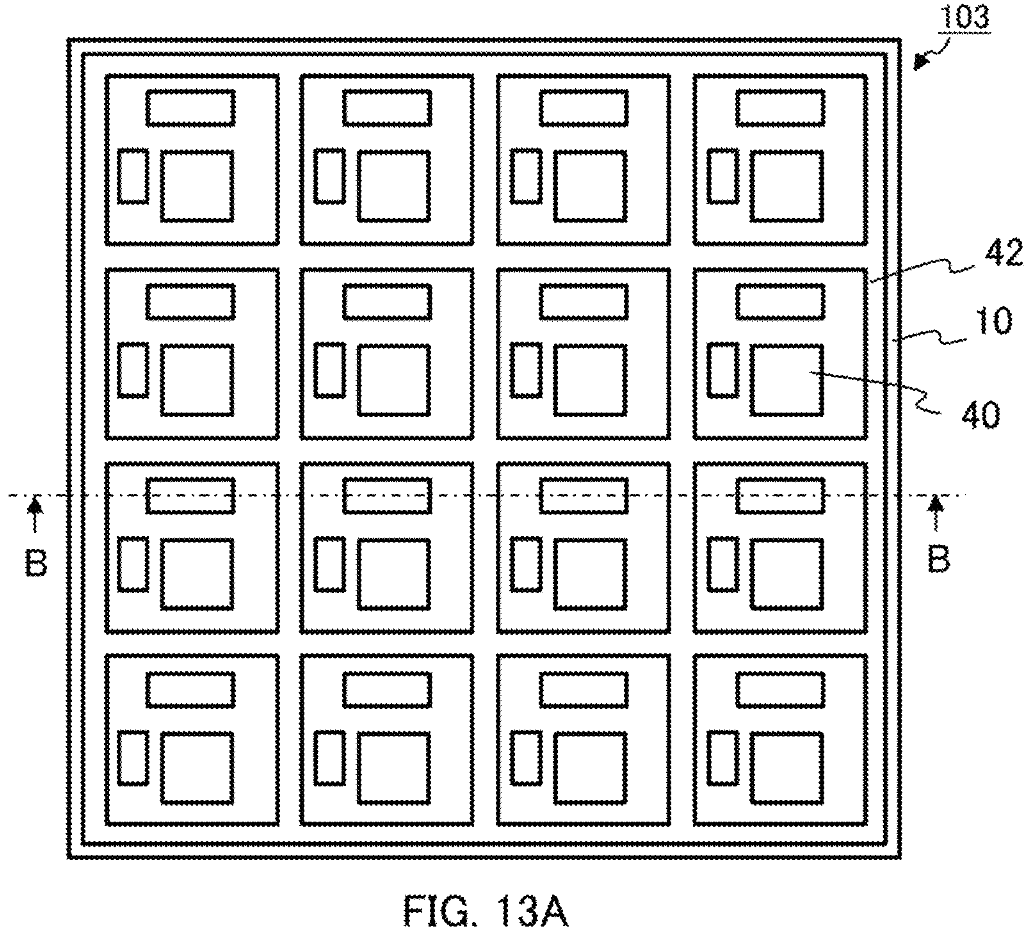
FIGS. 13A and 13B are a plan view and a sectional view showing a configuration of a semiconductor device module according to Embodiment 8.

FIG. 13A and FIG. 13B are views showing a configuration of a before-diced semiconductor device module according to Embodiment 8, in which the molded resin is not shown. FIG. 13A is a plan view, and FIG. 13B is a sectional view taken in the direction of the arrows along the line B-B of FIG. 13A.

As shown in FIG. 13A and FIG. 13B, the semiconductor device module 103 according to Embodiment 8 of the present application is configured such that the dummy block 42 that is made of the hard material having the good grindability for the diamond grinding wheel and have a height from the organic substrate 10 comparable to the heat dissipation blocks 40 is formed along the dicing lines (scribe lanes) of the organic substrate before diced. In Embodiment 8, the configuration of the other components of the semiconductor device module and the manufacturing method therefor is the same as with the semiconductor device module 101 according to Embodiment 1; hence, the same numeral references are assigned to the corresponding parts and descriptions thereof are omitted.

A method of manufacturing the semiconductor device module 103 according to Embodiment 8 of the present application is the same as with that of manufacturing the semiconductor device module 101 according to Embodiment 1 other than executing the dicing step (Step S406 in FIG. 4) after the grinding step (Step S407 in FIG. 4).

Since the soft material and the hard material are ground concurrently, the grinding wheel is sharpened (self-sharpened) when grinding the hard portion, thus being able to keep grinding performance of the grinding wheel. Moreover, by exposing from the surface of the module the heat dissipation blocks having the high thermal conductivity, heat dissipation from the devices can also be ensured. Furthermore, a conventional heat dissipation block can be used, and there is no need to provide spaces for forming in the module the dummy block having the good grindability.

As described above, the method of manufacturing the semiconductor device module 103 according to Embodiment 8 of the present application includes the step of mounting the devices on the surfaces of the organic substrate 10; the step of fixing the heat dissipation blocks 40 to the surfaces of the devices 20; a step of forming the dummy block 42 along the dicing line on the surface of the organic substrate 10; the step of sealing in the molding resin 50 the devices 20 having the heat dissipation blocks fixed to the surfaces of the devices; and the step of grinding the molded resin 50 until at least one surface of each heat dissipation block 40 is exposed, wherein the dummy block 42 is made of a material harder than the heat dissipation blocks 40 and has a height from the organic substrate 10 comparable to or higher than the heat dissipation blocks 40. Since the soft material and the hard material are ground concurrently, the grinding wheel is sharpened (self-sharpened) by grinding the hard portions, thus being able to keep grinding performance of the grinding wheel. Moreover, by exposing from the surface of the module the heat dissipation blocks having the high thermal conductivity, heat dissipation from the devices can also be ensured. Furthermore, a conventional heat dissipation block can be used, and there is no need to provide spaces for forming in the module the dummy block having a good grindability.

Although the present application describes various exemplary embodiments and implementations, it should be understood that various features and aspects and functionalities described in one or more of the individual embodiments are not limited to their applicability to the specific embodiment but instead can be applied alone or in various combinations to one or more of the embodiments. Therefore, numerous modifications that have not been exemplified are conceivable without departing from the technical scope disclosed in the specification of the present application. For example, at least one of the constituent components may be modified, added, or eliminated, and further at least one of the constituent components mentioned in at least one of the preferred embodiments may be selected and combined with the other constituent elements mentioned in another preferred embodiment.

REFERENCE NUMERALS

10: organic substrate;
20: devices;
40: heat dissipation blocks;
50: molded/molding resin;
41, 42: dummy block(s); and
101, 102, 103: semiconductor device module.

The invention claimed is:

1. A semiconductor device module comprising:

a device mounted on a surface of a substrate;

a heat dissipation block formed on a surface of the device; and a molded resin sealing the device with at least one surface of the heat dissipation block being exposed, wherein the heat dissipation block includes portions including a first portion and a second portion, the first portion being made of a first material, the second portion being made of a second material, and the first material being harder than the second material, the at least one surface is flush with the molded resin and includes the first portion exposed from the molded resin, and the heat dissipation block has a gradient in hardness from the first portion on a side exposed from the molded resin to the second portion on a side in contact with the device such that the hardness gradually changes across the gradient.

2. A method of manufacturing a semiconductor device module, comprising:

a step of mounting a device on a surface of a substrate;

a step of fixing a heat dissipation block to a surface of the device;

a step of sealing the device in a molded resin; and a step of grinding the molded resin until at least one surface of the heat dissipation block is disposed, wherein the heat dissipation block includes portions including a first portion and a second portion, the first portion being made of a first material, the second portion being made of a second material, and the first material being harder than the second material, the at least one surface is flush with the molded resin and includes the first portion exposed from the molded resin, and the heat dissipation block has a gradient in hardness from the first portion on a side exposed from the molded resin to the second portion on a side in contact with the device such that the hardness gradually changes across the gradient.

3. The method of manufacturing the semiconductor device module of claim 2, wherein the second portion is fixed to the surface of the device and the first portion is plated on side surfaces and a top surface of the second portion, and wherein the first portion plated at the top surface of the heat dissipation block is removed in the grinding step.

4. The method of manufacturing the semiconductor device module of claim 2, wherein the second portion is formed on the surface of the device and the first portion is formed on a top end of the second portion, and wherein the first portion at a top of the heat dissipation block is removed in the grinding step.

* * * * *